(12) United States Patent  (10) Patent No.: US 9,562,651 B2
Echigo et al.  (45) Date of Patent: Feb. 7, 2017

(54) LIGHTING APPARATUS

(75) Inventors: Takeshi Echigo, Osaka (JP); Yu Shinohara, Osaka (JP); Shoji Yamamoto, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 0 days.

(21) Appl. No.: 13/700,735

(22) PCT Filed: Apr. 1, 2011

(86) PCT No.: PCT/JP2011/058388
§ 371 (c)(1),
(2), (4) Date: Nov. 29, 2012

(87) PCT Pub. No.: WO2011/152115
PCT Pub. Date: Dec. 8, 2011

(65) Prior Publication Data
US 2013/0077318 A1 Mar. 28, 2013

(30) Foreign Application Priority Data
May 31, 2010 (JP) .................. 2010-124893

(51) Int. Cl.
F21S 4/00 (2016.01)
F21K 99/00 (2016.01)
(Continued)

(52) U.S. Cl.
CPC .................. *F21K 9/135* (2013.01); *F21K 9/23* (2016.08); *F21K 9/232* (2016.08); *F21V 3/00* (2013.01);
(Continued)

(58) Field of Classification Search
CPC .............. F21V 3/00; F21V 3/02; F21V 3/005; F21V 29/004; F21V 29/22; F21V 29/2206; F21V 29/2293; F21V 7/00; F21K 9/00; F21K 9/50; F21K 9/135; F21K 9/1355; F21Y 2101/02; F21Y 2105/001; H01L 25/0753; H01L 2924/00
(Continued)

(56) References Cited

U.S. PATENT DOCUMENTS 7,628,513 B2 * 12/2009 Chiu .................... 362/311.02
2005/0024834 A1 * 2/2005 Newby ................... F21K 9/00
361/719

(Continued)

FOREIGN PATENT DOCUMENTS

EP  2 484 966 A1  8/2012
JP  3-13608 U  2/1991
(Continued)

OTHER PUBLICATIONS

Japanese Office Action for related JP Application No. 2012-164111 mailed Jun. 25, 2013 with English translation.

*Primary Examiner* — Sean Gramling
(74) *Attorney, Agent, or Firm* — Birch, Stewart, Kolasch & Birch, LLP

(57) ABSTRACT

A lighting apparatus comprises: an LED module; a heat sink releasing heat generated by the LED module; and a light source supporting body having a locking part locking to the heat sink so as to hold the LED module on the heat sink. This avoids the necessity of screws used for attaching the LED module to the heat sink, and hence reduces the number of components and realizes easy attaching work for the light source. Thus, workability is improved in comparison with the conventional art.

2 Claims, 13 Drawing Sheets

(51) Int. Cl.
| | |
|---|---|
| *F21V 29/507* | (2015.01) |
| *F21V 3/00* | (2015.01) |
| *F21V 17/16* | (2006.01) |
| *F21V 19/00* | (2006.01) |
| *F21V 7/00* | (2006.01) |
| *F21V 15/00* | (2015.01) |
| *F21V 29/00* | (2015.01) |
| *F21V 3/04* | (2006.01) |
| *F21V 17/06* | (2006.01) |
| *F21V 23/00* | (2015.01) |
| *H05B 33/08* | (2006.01) |
| *H05K 3/00* | (2006.01) |
| *F21V 29/70* | (2015.01) |
| *F21V 29/71* | (2015.01) |
| *F21V 13/02* | (2006.01) |
| *H05K 1/02* | (2006.01) |
| *H05K 1/03* | (2006.01) |
| *F21V 29/89* | (2015.01) |
| *F21Y 101/00* | (2016.01) |

(52) U.S. Cl.
CPC ........... *F21V 3/0445* (2013.01); *F21V 7/0008* (2013.01); *F21V 15/00* (2013.01); *F21V 17/06* (2013.01); *F21V 17/164* (2013.01); *F21V 19/003* (2013.01); *F21V 19/004* (2013.01); *F21V 23/002* (2013.01); *F21V 23/006* (2013.01); *F21V 29/002* (2013.01); *F21V 29/507* (2015.01); *F21V 29/70* (2015.01); *F21V 29/713* (2015.01); *H05B 33/0803* (2013.01); *H05B 33/0815* (2013.01); *H05K 3/0061* (2013.01); *F21V 13/02* (2013.01); *F21V 29/89* (2015.01); *F21Y 2101/00* (2013.01); *F21Y 2105/10* (2016.08); *F21Y 2113/13* (2016.08); *F21Y 2115/10* (2016.08); *H01L 2224/48091* (2013.01); *H05K 1/0203* (2013.01); *H05K 1/0306* (2013.01); *H05K 2201/10106* (2013.01)

(58) Field of Classification Search
USPC .................. 362/264, 363, 373–375, 294
See application file for complete search history.

(56) References Cited

U.S. PATENT DOCUMENTS

| | | | |
|---|---|---|---|
| 2006/0141851 A1* | 6/2006 | Matsui et al. ................. | 439/490 |
| 2006/0227558 A1* | 10/2006 | Osawa et al. ................. | 362/351 |
| 2006/0232974 A1* | 10/2006 | Lee et al. ...................... | 362/294 |
| 2007/0253201 A1* | 11/2007 | Blincoe et al. ............... | 362/294 |
| 2007/0285926 A1* | 12/2007 | Maxik ........................... | 362/294 |
| 2008/0037255 A1* | 2/2008 | Wang ............................ | 362/294 |
| 2008/0158887 A1 | 7/2008 | Zhu et al. | |
| 2008/0205069 A1* | 8/2008 | Laporte ......................... | 362/363 |
| 2009/0195186 A1 | 8/2009 | Guest et al. | |
| 2010/0096992 A1 | 4/2010 | Yamamoto et al. | |
| 2011/0090699 A1* | 4/2011 | Shida .................... | F21K 9/1355 362/294 |
| 2011/0104935 A1 | 5/2011 | Kitamura et al. | |

FOREIGN PATENT DOCUMENTS

| | | | | |
|---|---|---|---|---|
| JP | 9-259997 A | 10/1997 | | |
| JP | 2002-304902 A | 10/2002 | | |
| JP | 2006-313717 A | 11/2006 | | |
| JP | 2007-273209 A | 10/2007 | | |
| JP | 2009-16059 A | 1/2009 | | |
| JP | 2009-021144 A | 1/2009 | | |
| JP | 2009-163954 A | 7/2009 | | |
| JP | WO 2010004702 A1 * | 1/2010 | .......... | F21K 9/1355 |
| JP | 2010-40223 A | 2/2010 | | |
| JP | 2010-40364 A | 2/2010 | | |
| JP | 2010-73438 A | 4/2010 | | |
| JP | 2010-80072 A | 4/2010 | | |
| JP | 2011-513917 A | 4/2011 | | |
| WO | WO 2009/108337 A1 | 9/2009 | | |
| WO | WO 2009/154100 A1 | 12/2009 | | |

\* cited by examiner

LIGHTING APPARATUS

This application is the national phase under 35 U.S.C. §371 of PCT International Application No. PCT/JP2011/058388 which has an International filing date of Apr. 1, 2011 and designated the United States of America.

BACKGROUND

Technical Field

The present invention relates to a lighting apparatus provided with a light source and, in particular, to a lighting apparatus having the shape of an electric bulb.

Description of Related Art

In recent years, with advancement in development of high luminance light emitting diodes (LEDs), in place of light sources such as incandescent lamps and fluorescent lamps, LEDs having features of low power consumption, long life, and the like are increasingly widely used as light sources in lighting apparatuses or the like.

A lighting apparatus employing as a light source a light emitting element such as an LED includes: a board on which the LED is mounted; and a heat sink releasing heat generated by the LED. For example, a lamp is disclosed in which a board on which an LED is mounted is brought into close contact with a board mounting surface of a heat sink fabricated from aluminum and then they are attached to each other with screws (see Japanese Patent Application Laid-Open No. 2010-73438).

SUMMARY

Nevertheless, in the lamp according to Japanese Patent Application Laid-Open No. 2010-73438, the board is attached to the board mounting surface of the heat sink with screws. Thus, these screws are necessary and hence a problem arises that attaching work for the board is complicated and causes unsatisfactory workability.

The present invention has been devised in view of such a situation. Its object is to provide a lighting apparatus in which attaching workability of the light source is improved.

The lighting apparatus according to the present invention is characterized by comprising: a light source; a heat sink releasing heat from the light source; and a light source supporting body having a locking part locking into the heat sink so as to hold the light source on the heat sink.

In the present invention, the light source supporting body is provided that has a locking part locking into the heat sink so as to hold the light source on the heat sink. This avoids the necessity of screws used for attaching the light source to the heat sink, and hence reduces the number of components. Further, light source attaching work is completed merely by locking and attaching the light source supporting body to the heat sink. Thus, the work of attaching a plurality of screws into screw holes provided in the light source, which has been necessary in the conventional art, becomes unnecessary. That is, attaching work for the light source is simplified and workability is improved in comparison with the conventional art.

The lighting apparatus according to the present invention is characterized in that the light source supporting body and/or the heat sink includes a fitting part fitting to the light source so as to position the light source.

In the present invention, the light source supporting body and/or the heat sink includes a fitting part fitting to the light source so as to position the light source. Thus, when the light source is fitted into the fitting part, the light source is held by the heat sink. Accordingly, the light source is reliably attached at a given position and hence easily positioned. This improves attaching workability.

The lighting apparatus according to the present invention is characterized in that the light source supporting body includes a light extracting part extracting light from the light source.

In the present invention, the light source supporting body includes a light extracting part extracting light from the light source. Thus, even when the light source is held between the light source supporting body and the heat sink, light from the light source is extracted through the light extracting part so that lighting is achieved.

The lighting apparatus according to the present invention is characterized by further comprising a cover covering the light source, and in that the light source supporting body serves also as a reflection part reflecting light emitted from the light source and then reflected by the cover.

In the present invention, the light source supporting body has the function of holding the light source and simultaneously the function of a reflection part reflecting light having been reflected by the cover. This avoids the necessity of a reflection part provided separately, and hence contributes to the reduction of the number of components.

The lighting apparatus according to the present invention is characterized in that the heat sink includes a penetration part through which wiring connected to the light source penetrates, and the light source supporting body includes a protecting part avoiding a situation that the wiring penetrating through the penetration part is damaged by the heat sink.

In the present invention, the light source has electrodes connected to wiring. The heat sink includes a penetration part through which the wiring penetrates. Further, the light source supporting body includes a protecting part avoiding a situation that the wiring penetrating through the penetration part is damaged by the heat sink. Thus, the protecting part protects the wiring against damage that could be caused by a burr, a corner, or an edge formed in the periphery of the penetration part in the heat sink.

The present invention avoids the necessity of screws used for attaching the light source to the heat sink, and hence reduces the number of components and realizes easy attaching work for the light source. Thus, workability is improved in comparison with the conventional art.

The above and further objects and features of the invention will more fully be apparent from the following detailed description with accompanying drawings.

DETAILED DESCRIPTION

Figure 1:
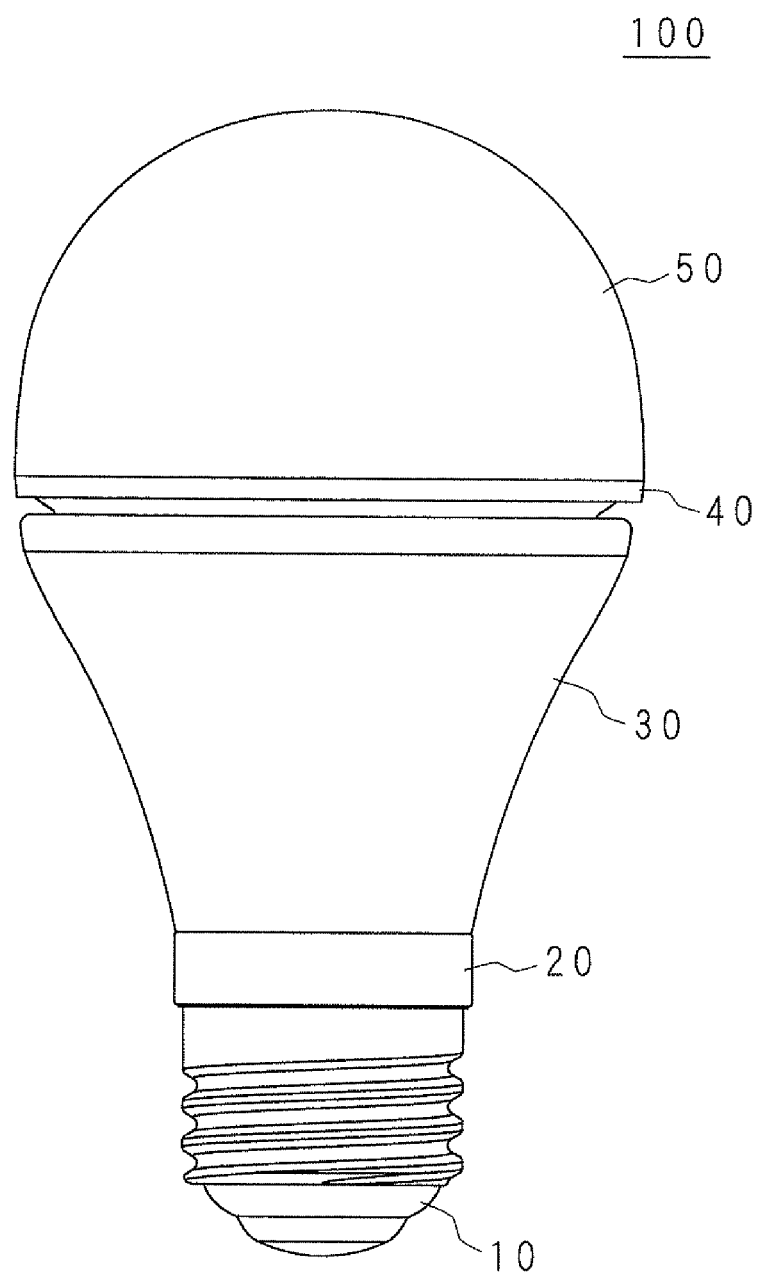
FIG. 1 is an external appearance view of a lighting apparatus according to an embodiment.
Figure 2:
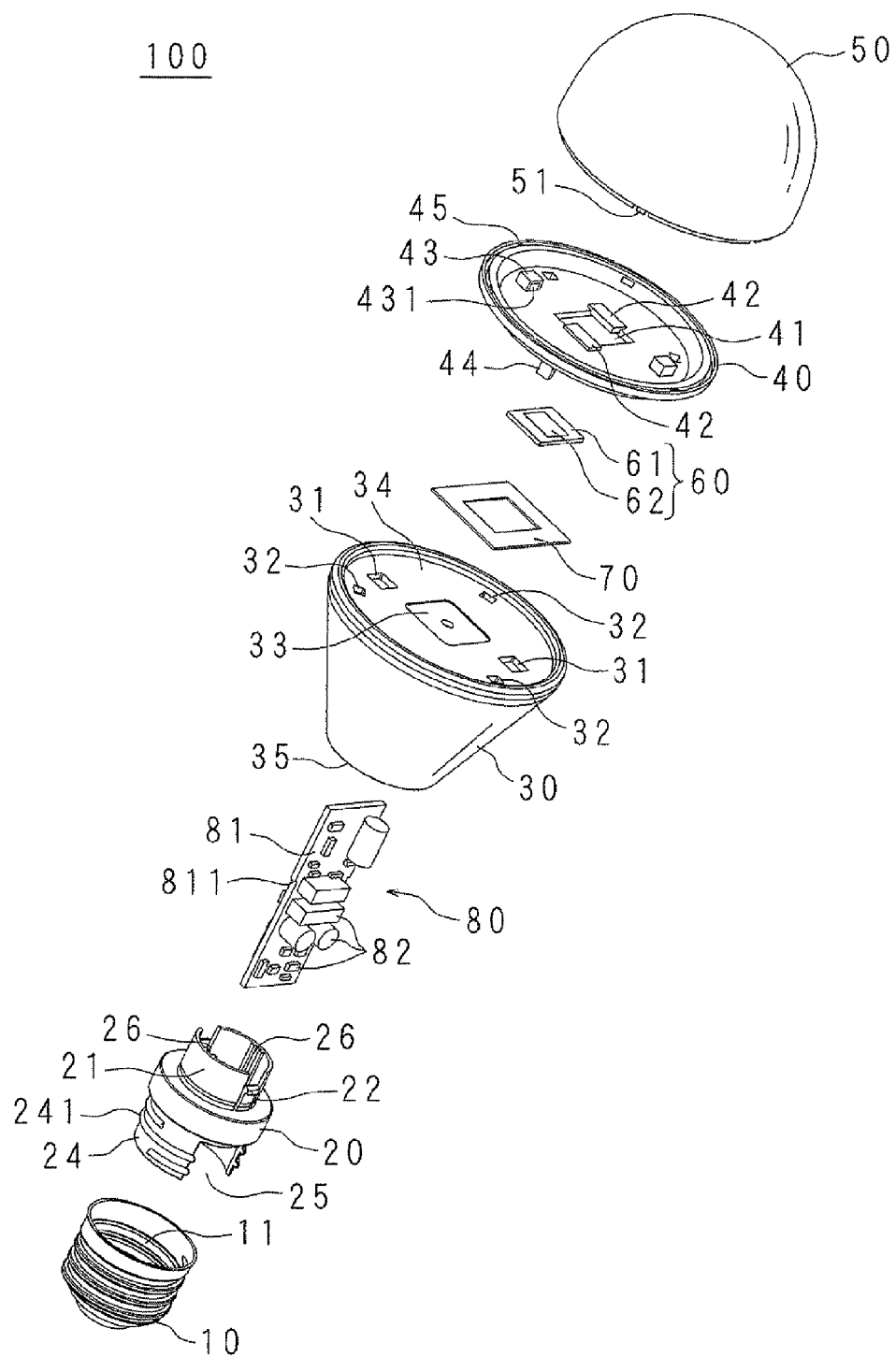
FIG. 2 is an exploded perspective view of a main part of a lighting apparatus according to an embodiment.
Figure 3:
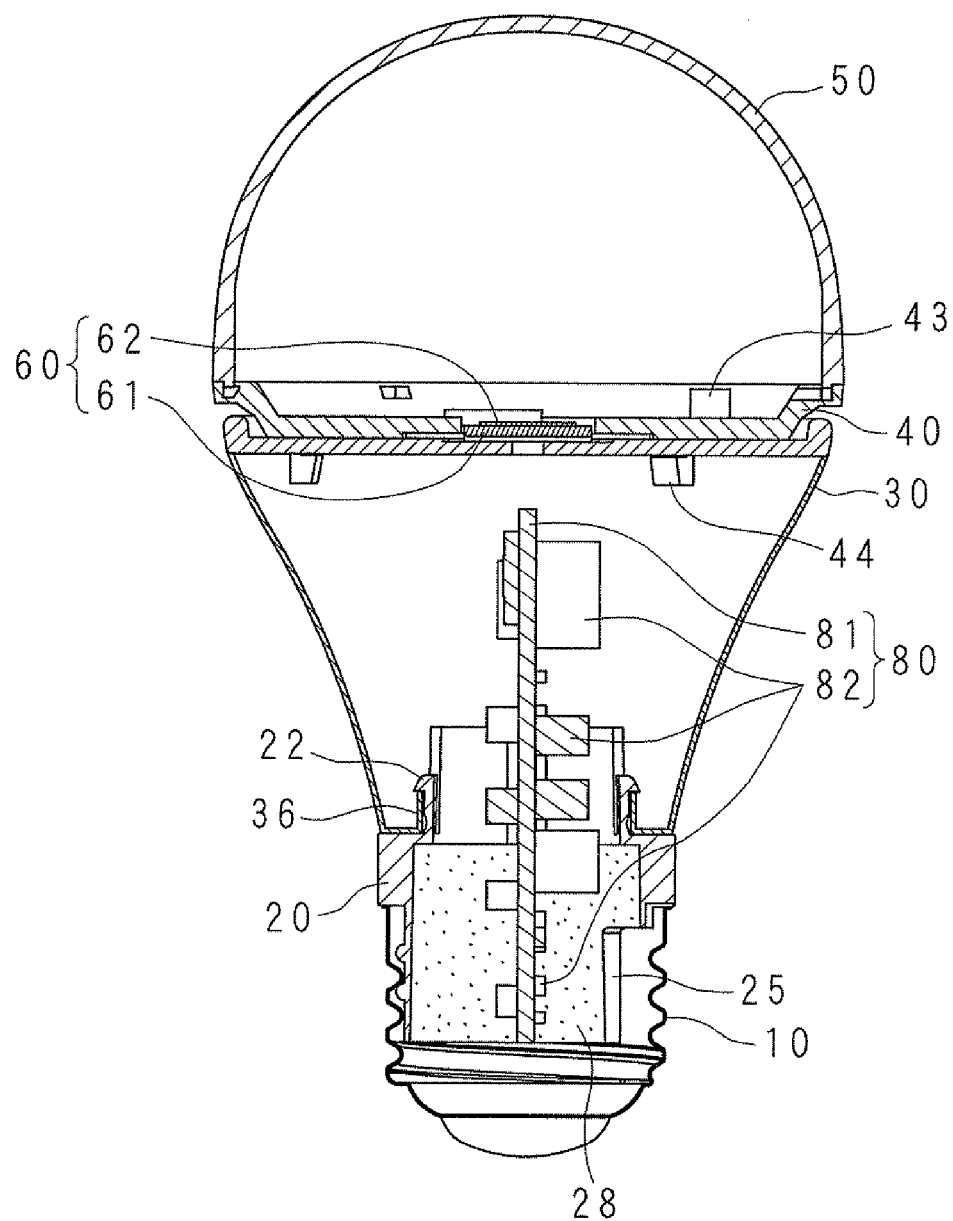
FIG. 3 is a sectional front view of a lighting apparatus according to an embodiment.
Figure 4:
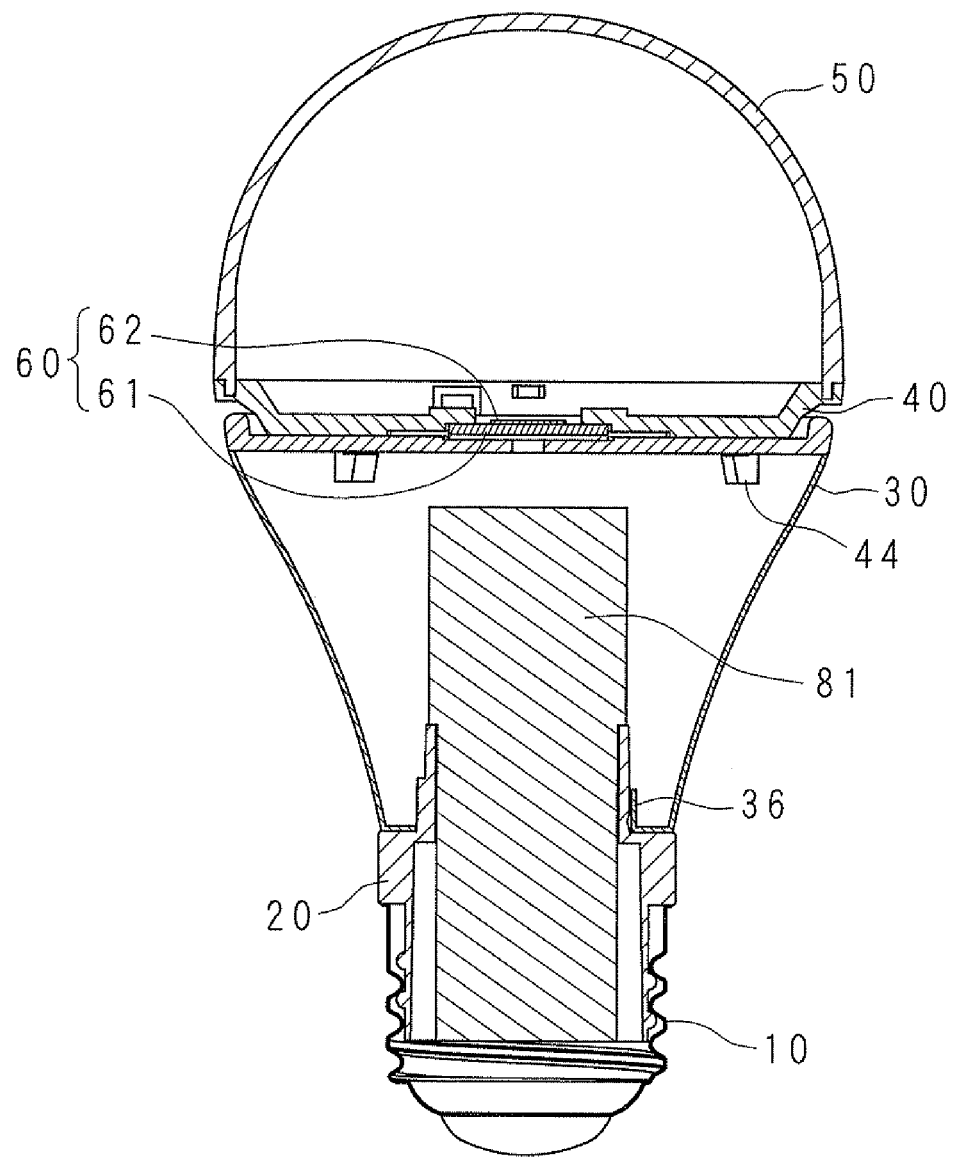
FIG. 4 is a sectional side view of a lighting apparatus according to an embodiment.

The present invention is described below with reference to the drawings illustrating an embodiment. FIG. 1 is an external appearance view of a lighting apparatus 100 according to the present embodiment. FIG. 2 is an exploded perspective view of a main part of the lighting apparatus 100 according to the present embodiment. FIG. 3 is a sectional front view of the lighting apparatus 100 according to the present embodiment. FIG. 4 is a sectional side view of the lighting apparatus 100 according to the present embodiment. The lighting apparatus 100 has the shape of an electric bulb of 40 W, 60 W, or the like.

As illustrated in FIG. 1, in the external appearance view, the lighting apparatus 100 includes: a cap 10 to be inserted into a socket in the outside so as to be electrically connected to a commercial power source; a heat sink 30 having a hollow (cylindrical) shape so as to release heat generated by the lighting apparatus 100; a cylindrical insulating member 20 linking the cap 10 and the heat sink 30 to each other and electrically insulating them; an approximately disk-shaped light source supporting body 40 holding on the heat sink 30 a later-described LED module serving as a light source; a cover 50 having the shape of an approximately semispherical shell.

Detailed description is given below with reference to FIGS. 2 to 4. The cap 10 is a socket of E26 cap standard or the like, and has a hollow part 11. A screw thread is provided in the periphery of the cap 10. Here, the employed cap standard may be other than E26. That is, another cap standard such as E17 may be employed.

The insulating member 20 has a cylindrical shape and is fabricated from, for example, poly butylene terephthalate (referred to as PBT, hereinafter) resin which is excellent in heat resistance, chemical resistance, electrical property (insulation), dimensional stability, formability, fire retardancy, and the like. Here, employable construction materials are not limited to PBT resin. For example, ABS resin may be employed that has an electrically insulating property.

The cap side of the insulating member 20 has a cylindrical connection part 24 provided in the inside of the cap 10. In the connection part 24, a male screw thread 241 to be screwed into a female screw whose screw thread is formed in the inner peripheral surface of the cap 10 is formed in the outer periphery of the connection part 24. Thus, the cap 10 and the insulating member 20 are attached to each other by merely screwing. This avoids the necessity of screws and hence simplifies the assembling work. Here, employable methods of connection of the connection part 24 to the cap 10 are not limited to that the screw thread 241 is screwed into the female screw formed in the inside of the cap, and may be, for example, that a locking part having the shape of a claw formed in the connection part 24 is locked into a notch provided in the inner wall of the cap 10 so that connection is achieved.

Further, in the connection part 24 of the insulating member 20, opening parts 25 are formed at two places. In the present embodiment, the two opening parts 25 are provided at two periphery positions of the connection part 24 in a mutually opposite positional relation. Thus, the inside of the connection part 24 is directly covered by the cap 10 in the opening parts 25 without being blocked by the connection part 24 itself. Here, in the example of FIG. 2, each opening part 25 has a rectangular shape and is in the form of a notch. However, employable shapes are not limited to this. For example, in place of a notch, a large number of holes may be formed. Here, the number of opening parts 25 to be provided in the connection part 24 is not limited to two as in the configuration of the present embodiment. That is, a single opening part alone may be employed or, alternatively, three or more opening parts may be employed. In conclusion, it is sufficient that a portion where the inside of the connection part 24 is directly covered by the cap 10 is present.

The heat sink side of the insulating member 20 has an inserted part 21 to be inserted into an open part 35 of the heat sink 30. The inserted part 21 has a fitting part 22 to be fitted to a fixing piece 36 of the heat sink 30. That is, when the fitting part 22 is merely fitted to the fixing piece 36, the heat sink 30 and the insulating member 20 are attached to each other. This avoids the necessity of screws and hence simplifies the assembling work.

In the insulating member 20, the inner peripheral surface has pinching parts 26 pinching a power source board 81 of a power supply part 80. The pinching parts 26 are composed of line-shaped grooves provided at two places in the direction from the cap 10 side to the heat sink 30 side in opposite to the inner peripheral surface of the insulating member 20. The two grooves are formed between two line-shaped protrusions provided in the direction from the cap 10 side to the heat sink 30 side in the inner peripheral surface of the insulating member 20. When the rims along the longitudinal direction of the power source board 81 having an approximately rectangular shape are fitted into the pinching parts 26, the power source board 81 is pinched. The power source board 81 is fixed to the insulating member 20 when the pinching parts 26 merely pinch the rims of the power source board 81. This avoids the necessity of screws in attaching the power source board 81, and hence simplifies the assembling work. Here, the pinching parts 26 are not limited to the configuration of the above-mentioned two protrusions. That is, grooves composed of line-shaped recesses may be formed in the inner peripheral surface of the insulating member 20.

Step parts 811 are provided in the middle of the rims of the longitudinal direction of the power source board 81. When the power source board 81 is inserted into the pinching parts 26, the step parts 811 abut against the end of the inserted part 21. This avoids a situation that the power source board 81 is inserted into the insulating member 20 deeper than the position where the step parts 811 of the power source board 81 abut against the ends of the inserted part 21. This realizes easy positioning of the power source board 81. In the present embodiment, the position of attaching the power source board 81 to the insulating member 20 is determined such that the position of the ends on the side to be inserted into the insulating member 20 of the power source board 81 and the position of the ends of the connection part 24 should approximately match. As a result, a part of the power supply part 80 is located in the inside of the insulating member 20.

The power supply part 80 supplies electricity to the LED module 60. In the power supply part 80, a plurality of electric components (including electronic components) 82 are mounted on the power source board 81. The circuit configuration of the power supply part 80 is described later.

The LED module 60 serving as the light source of the lighting apparatus 100 according to the present embodiment includes: a base 61 having a rectangular shape; and an LED 62 serving as a light emitting part mounted on the base 61. The LED module 60 is composed of, for example, an LED module of so-called chip-on-board type in which LEDs 62 composed of a plurality (e.g., 30, 40, or the like) of LED chips emitting white light are provided in a lattice arrangement on a base 61 composed of a ceramic substrate and then the plurality of LEDs 62 are sealed with resin material containing fluorescent substance. Here, the LEDs 62 are not limited to white LEDs, and may be LEDs of electric bulb color. Alternatively, white LEDs and electric bulb color LEDs may be employed in mixture. In a case that white LEDs and electric bulb color LEDs are employed in mixture, emission color is allowed to be changed between white and electric bulb color when the ON-OFF states of the individual LEDs are controlled.

Here, light sources employable in the lighting apparatus according to the present invention are not limited to an LED module of chip-on-board type like the above-mentioned LED module 60 in which a plurality of LED chips serving as a light emitting part of the light source are provided in a lattice arrangement on a ceramic substrate serving as a base of the light source and then the plurality of LED chips are sealed with resin material containing fluorescent substance. That is, the above-mentioned base may be composed of a printed circuit board fabricated from glass epoxy or the like in which a conductor pattern is formed. Further, the light emitting part may be composed of an LED of so-called surface mount type constructed from: LED chips; sealing resin sealing the LED chips; and input terminals and output terminals.

For example, the heat sink 30 is fabricated from metal such as aluminum having excellent thermal conductivity, and has a hollow cylindrical shape. For example, the heat sink 30 is fabricated by press working. Thus, when the thickness of the heat sink 30 is reduced, weight reduction is achieved. In the heat sink 30, one end side has a mounting surface 34 provided with the LED module 60. The other end side has a circular open part 35 through which the inserted part 21 is inserted into the hollow part of the heat sink. Here, employable methods of fabrication of the heat sink 30 are not limited to press working, and may be die casting.

A heat releasing sheet 70 larger than the size of the LED module 60 (the base 61) is arranged between the mounting surface 34 and the LED module 60. In the present embodiment, in an example, the heat releasing sheet 70 is set to be larger than the size of the base 61 of the LED module, and the heat releasing sheet 70 has dimensions realizing a configuration that the creeping distance between the electrodes of the LED module 60 and the heat sink 30 is approximately 3 mm. For example, the construction material of the heat releasing sheet 70 may be silicone gel. When the heat releasing sheet 70 is located between the base 61 and the heat sink 30 in close contact with them, heat generated by the LED module 60 is transmitted to the heat sink 30 and hence the heat is efficiently released through the heat sink 30.

Further, since the heat releasing sheet 70 larger than the size of the base 61 is provided, a larger value is obtained in the distance from the end of the base 61 to the end of the heat releasing sheet 70. Thus, a larger value is obtained in the creeping distance between the electrode of the LED module 60 and the heat sink 30. Thus, the dielectric strength voltage is improved, and a satisfactory value is ensured in the insulation distance (air clearance) defined in various kinds of standards. Here, employable sizes in the heat releasing sheet 70 are not limited to a value realizing a creeping distance of approximately 3 mm as described above. That is, an arbitrary size may be employed as long as a sufficient value is ensured in the insulation distance between the electrode of the LED module 60 and the heat sink 30.

Near the center of the mounting surface 34, a recess 33 is formed that serves as a fitting part fitting to the LED module 60 and positioning it. The recess 33 is formed in a rectangular shape corresponding to the shape of the base 61 of the LED module 60. Specifically, the size of the rectangle of the recess 33 is formed slightly larger than the base 61, and hence the base 61 is allowed to be fitted in. Thus, when the base 61 is fitted into the recess 33, the LED module 60 is reliably attached at a given position and hence easily positioned. This improves attaching workability.

The mounting surface 34 has a penetration part 31 through which wiring (electric wires, a wiring flexible board, or the like) to be connected to the electrodes provided in the surface of the base 61 of the LED module 60 is inserted and then led to the power supply part 80 contained in the heat sink 30.

Further, the mounting surface 34 has three locking holes 32 used for locking parts 44 provided in the light source supporting body 40. Here, the number of employed locking holes 32 is not limited to three. That is, two, four, or more locking holes 32 may be formed.

The light source supporting body 40 has a disk shape and is fabricated from polycarbonate resin. When the light source supporting body 40 is locked to the heat sink 30, the LED module 60 is attached to and held on the heat sink 30 by the light source supporting body 40. That is, the light source supporting body 40 is attached to the heat sink 30 when the locking parts 44 are locked into the locking holes 32 in order that the LED 60 should be attached to the heat sink 30. This avoids the necessity of screws used for attaching the LED module 60 to the heat sink 30, and hence reduces the number of components. Further, according to the present embodiment, the work of attaching the LED module 60 is completed merely by locking and attaching the light source supporting body 40 to the heat sink 30. This avoids the necessity of the work of screwing a plurality of screws into individually corresponding screw holes like in the conventional art. Thus, attaching work for the LED module 60 becomes easy, and hence workability is improved in comparison with the conventional art.

More specifically, the light source supporting body 40 has the locking parts 44 locking into the locking holes 32 formed in the mounting surface 34 of the heat sink 30. By locking the locking parts 44 into the locking holes 32, the LED module 60 is attached to the heat sink 30 without the use of screws. This reduces the number of components and simplifies the attaching work for the LED module 60. Thus, workability is improved in comparison with the conventional art. That is, when the locking parts 44 are locked into the locking holes 32, the light source supporting body 40 is locked by the heat sink 30 so that the LED module 60 is mounted on the heat sink 30 without the use of screws. Further, simultaneously to the attaching of the light source supporting body 40, the LED module 60 is held between the light source supporting body 40 and the heat sink 30. This simplifies the attaching work for the LED module 60, and simplifies the assembling work.

Further, near the center part of the light source supporting body 40, the fitting hole 41 is provided that serves as a fitting part fitting to the LED module 60 so as to position the LED module 60. The fitting hole 41 has approximately the same size as the base 61, and fits to the base 61 so as to position the LED module 60. The base 61 of the LED module 60 is fitted into the fitting hole 41 of the light source supporting body 40 so that the LED module 60 is mounted and held on the heat sink 30. Thus, the LED module 60 is reliably attached at a given position and hence easily positioned. This improves attaching workability.

Further, at the same time that the fitting hole 41 positions the LED module 60, the inner periphery part of the fitting hole 41 fixes the attaching position with respect to the periphery of the LED module 60. This avoids a situation that the LED module 60 moves and shift in a direction parallel to the light source supporting body 40.

The light source supporting body 40 has protruding parts 42 in a part of the periphery of the fitting hole 41. Then, a part of the base 61 is arranged between each protruding part 42 and the heat sink 30. That is, the LED module 60 fitted into the fitting hole 41 of the light source supporting body 40 is held when the base 61 is inserted between the heat sink 30 and the protruding part 42. Thus, without the necessity of screws, the LED module 60 is reliably attached to the heat sink 30.

That is, each protruding part 42 pinches the base 61 between itself and the heat sink 30 so as to hold the light source. Thus, the LED module 60 is prevented from moving in a direction perpendicular to the light source supporting body 40, and hence attaching position is fixed. Thus, the protruding parts 42 prevent the LED module 60 from dropping out from the fitting hole 41 of the light source supporting body 40.

Further, the base 61 and the fitting hole 41 have rectangular shapes, and the protruding parts 42 are provided at two places near two mutually opposite corners on a diagonal line of the fitting hole 41. Thus, the base 61 is pinched by the heat sink 30 and the protruding parts 42 with satisfactory balance near the two mutually opposite corners on the diagonal line of the base 61 of the LED module 60. Thus, the LED module 60 is reliably attached to and held on the heat sink 30 without the use of screws.

Here, the number of employed protruding parts 42 is not limited to two as in the description given above. That is, one, three, or more protruding parts may be employed. For example, when four protruding parts 42 are provided at four places in the corners of the fitting hole 41, the four corners of the LED module 60 are pinched between each protruding part 42 and the heat sink 30. Thus, the LED module 60 is more stably held between each protruding part 42 and the heat sink 30, and hence the possibility of dropping out is reduced. Further, employable plane view shapes of each protruding part 42 are not limited to a rectangular shape. That is, an arbitrary shape may be employed as long as the LED module 60 is pinched between each protruding part 42 and the heat sink 30. Further, employable positions for the protruding parts 42 are not limited to the vicinity of the corners on a diagonal line. That is, the protruding parts 42 may be provided on mutually opposite side-edges of the fitting hole 41.

As described above, the light source supporting body 40 holds the LED module 60 by a method that the edge parts of the base 61 where the LEDs 62 are not mounted are held between the protruding parts 42 and the heat sink 30. Thus, since the LED module 60 is held at the base 61 in a state that the LEDs 62 are not covered but exposed, the light source supporting body 40 forms the fitting hole 41 serving also as a light extracting part extracting light from the LEDs 62. Thus, despite that the LED module 60 is pinched and held between the light source supporting body 40 and the heat sink 30, the light source supporting body 40 forms the fitting hole 41 serving as a light extracting part extracting light from the LED module 60, and thereby extracts light through the fitting hole 41 so as to realize lighting.

The heat sink 30 has the penetration part 31 through which wiring connected to the electrodes on the base 61 of the LED module 60 is inserted. Further, the light source supporting body 40 has the fit-in part 43 fitted into the penetration part 31. Then, an insertion hole 431 through which the above-mentioned wiring is inserted is formed in the fit-in part 43. That is, the wiring connected to the electrodes on the base 61 of the LED module 60 is led to the inside of the heat sink 30 through the insertion hole 431 formed in the fit-in part 43. This simplifies the wiring work for the LED module 60 in which the electrodes are provided on the light emitting part side of the base 61.

Further, the fit-in part 43 is fitted into the penetration part 31 of the heat sink 30. This avoids a situation that the wiring such as an electric wire and a wiring board goes into direct contact with a burr, a corner, an edge, or the like of the metal material that is present in the periphery of the penetration part 31 of the heat sink 30. Thus, the wiring is protected by the fit-in part 43 of the light source supporting body 40 fabricated from resin. That is, the fit-in part 43 serves as a protecting part avoiding a situation that the wiring inserted through the penetration part 31 is damaged with a burr, a corner, an edge, or the like of the heat sink 30. Thus, the above-mentioned wiring is prevented from being damaged.

The light source supporting body 40 is fabricated from light reflective synthetic resin obtained by mixing white pigment such as titanium oxide. Since the light source supporting body 40 fabricated from synthetic resin obtained by mixing white pigment is employed, the necessity of forming of a reflection film or providing of a reflective sheet is avoided. This reduces the number of components and improves assembling workability. Further, since a high reflectivity of approximately 90% to 95% is achieved, light having been reflected in the inside of the cover 50 and having returned to the light source supporting body 40 side is reflected again by the light source supporting body 40 serving as a reflection part, so that the emission efficiency of the lighting apparatus 100 is improved. That is, the light source supporting body 40 has the function of holding the light source and simultaneously the function of a reflection part reflecting light having been reflected by the cover 50. This avoids the necessity of a reflection part provided separately, and hence contributes to the reduction of the number of components. Employable materials in the light source supporting body 40 include "LR8031V" available from Sumitomo Dow Limited. In this case, a reflectivity of approximately 95% is obtained.

Here, when the light source supporting body 40 is desired to serve also as a reflection part, employable configurations are not limited to that the light source supporting body 40 is fabricated from synthetic resin having light reflectivity. That is, a configuration may be employed that the above-mentioned reflection film or reflective sheet is provided in the surface of the light source supporting body 40. However, a configuration that the entirety of the light source supporting body 40 is fabricated from synthetic resin having light reflectivity has an advantage over a configuration employing a reflection film or a reflective sheet, in the point that a possibility of decrease in the reflection function caused by degradation or wear is reduced.

In the light source supporting body 40, the contact surface with the cover 50 has a recess 45.

For example, the cover 50 is fabricated from polycarbonate resin of opaque white. The cover 50 has the contact surface with the light source supporting body 40 which has a protruding part 51 fitting into the recess 45. When the protruding part 51 is merely fitted into the recess 45, the light source supporting body 40 and the cover 50 are attached to each other. This avoids the necessity of screws and hence simplifies the assembling work. When the protruding part 51 is fitted into the recess 45, positioning of the cover 50 is achieved and the cover 50 is prevented from revolving relative to the light source supporting body 40.

Figure 5:
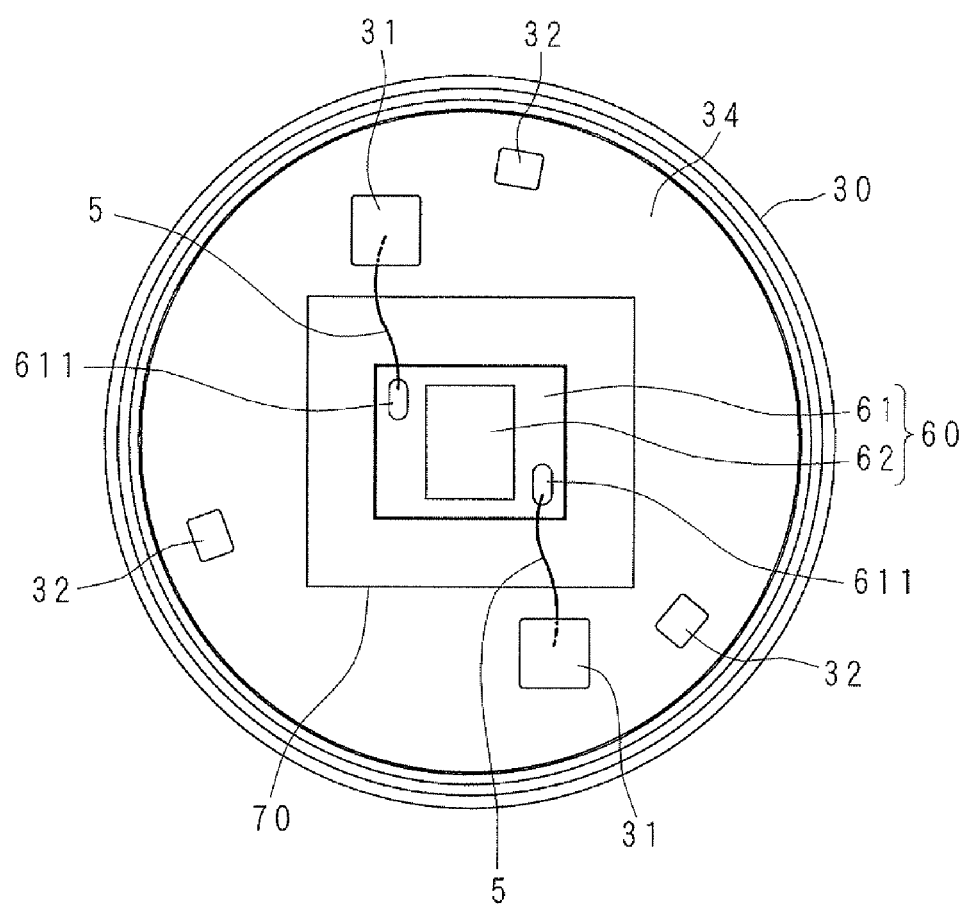
FIG. 5 is a plan view of a mounting surface side of a heat sink.

FIG. 5 is a plan view of the mounting surface side of the heat sink 30. The example of FIG. 5 illustrates a situation that the LED module 60 and the heat releasing sheet 70 are mounted on the mounting surface 34 but that the light source supporting body 40 is not yet mounted.

The wiring 5 connected to the electrodes 611 on the base 61 of the LED module 60 is inserted into the insertion hole 431 formed in the fit-in part 43 (not illustrated in the example of FIG. 5), and is then led through the penetration part 31 of the heat sink 30 to the inside of the heat sink 30. Thus, the LED module 60 in which the electrodes 611 are provided on the light emitting part side of the base 61 is attached easily. Further, the fit-in part 43 is fitted into the penetration part 31 of the heat sink 30. This avoids a situation that the wiring 5 such as electric wires and a wiring flexible board goes into direct contact with a burr, a corner, an edge, or the like of the metal material of the penetration part 31 of the heat sink 30. Thus, the wiring 5 is protected by the fit-in part 43 of the light source supporting body 40 fabricated from resin, and hence damage caused by the penetration part 31 is avoided. That is, the fit-in part 43 serves as a protecting part protecting the wiring 5 from the penetration part 31.

Figure 6:
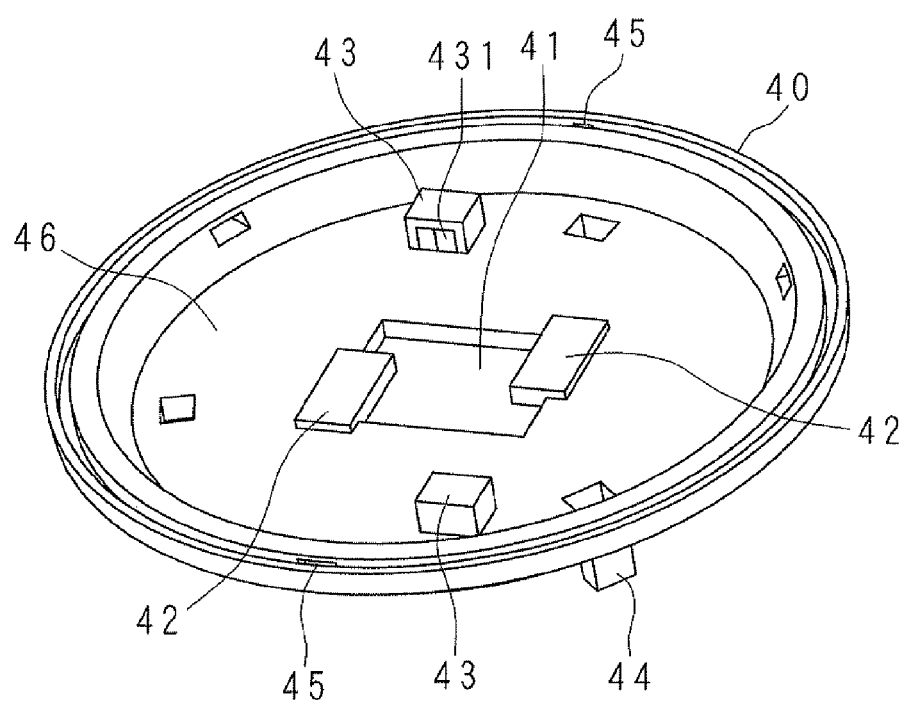
FIG. 6 is a perspective view taken from a cover side of a light source supporting body.
Figure 7:
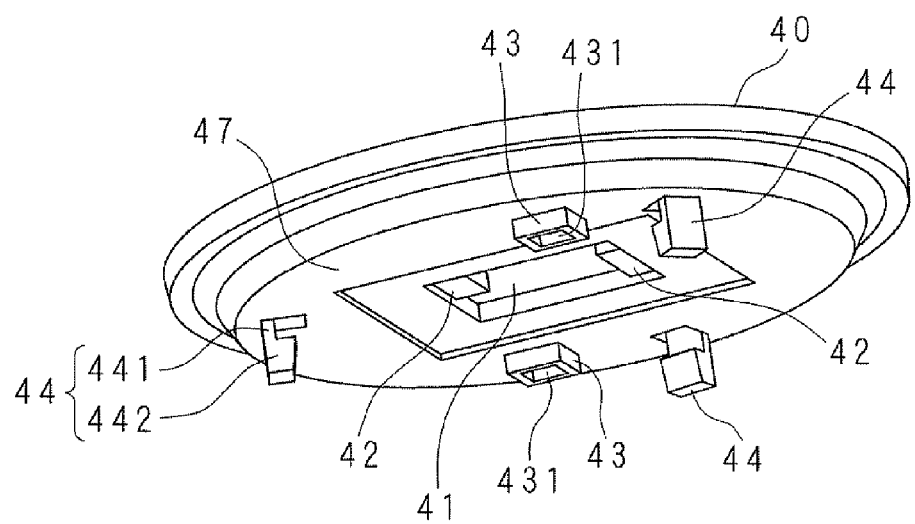
FIG. 7 is a perspective view taken from a heat sink side of a light source supporting body.

FIG. 6 is a perspective view taken from the cover side of the light source supporting body 40. FIG. 7 is a perspective view taken from the heat sink side of the light source supporting body 40. In the light source supporting body 40, the vicinity of the center has the fitting hole 41 which has approximately the same size as the base 61 and into which the base 61 fits. The base 61 of the LED module 60 is fitted into the fitting hole 41 of the light source supporting body 40 so that the LED module 60 is mounted on the heat sink 30. Thus, the LED module 60 is reliably attached at a given position and hence easily positioned. This improves attaching workability.

Further, the protruding parts 42 are provided in a part of the periphery of the fitting hole 41. Then, a part of the base 61 is arranged between each protruding part 42 and the heat sink 30. That is, the LED module 60 fitted into the fitting hole 41 of the light source supporting body 40 is held when the base 61 is inserted between the heat sink 30 and the protruding part 42. Thus, without the necessity of screws, the LED module 60 is reliably attached to the heat sink 30.

Further, in the example according to the present embodiment illustrated in FIG. 6 and the like, the fitting hole 41 and the protruding parts 42 are provided so that the LED module 60 is prevented from moving and shifting in directions parallel and perpendicular to the light source supporting body 40 and hence the attaching position is fixed. Instead, a configuration may be employed that the fitting hole 41 or the protruding parts 42 are not provided. In this configuration, for example, when a part of the base 61 is pressed against the heat sink 30 by the light source supporting body 40, the LED module 60 is held. That is, when the LED module 60 is pressed, a static friction force from the heat sink 30 or the light source supporting body 40 prevents the LED module 60 from moving in a direction parallel to the light source supporting body 40.

Further, the number of components constituting the light source supporting body 40 is not limited to unity as in the present embodiment. That is, a plurality of components may be employed. For example, a light source supporting body composed of two members may hold two ends of the base 61 between the light source supporting body and the heat sink 30.

In a case that the base of the light source on which a light emitting part is mounted is fabricated from ceramics as in the present embodiment, when the base is directly fixed with screws, a possibility arises that a stress is concentrated on the portion where the screws are attached so that the base could be damaged. In the lighting apparatus according to the present application, even when the base is fabricated from ceramics, the base 61 is held between the light source supporting body 40 and the heat sink 30 without a pressure on the base, where the fitting hole 41 and the protruding parts 42 constrain the periphery of the light source module 60. Thus, the possibility is reduced that when the screws are fixed into the screw holes provided in the base, a stress is concentrated on the screw holes so that the base is damaged.

Further, in a case that screw holes are directly provided in the base of the light source made from ceramics and then screws are fixed into the screw holes so that the light source is fixed to the heat sink, when material such as ceramics easily suffering brittle fracture is employed, a problem arises that unsatisfactory accuracy is caused in machining of the screw holes and hence difficulty is caused in the machining of the screw holes. However, in the configuration according to the present embodiment where the light source is held on the heat sink 30 by the light source supporting body 40, the necessity of screw holes in the base is avoided and the light source is easily attached to the heat sink 30.

The fit-in part 43 has an approximately rectangular parallelepiped shape. Then, on the upper face 46 side, the insertion hole 431 is formed in a direction intersecting the upper face 46. On the lower surface 47 side, the insertion hole 431 is formed in a direction parallel to the lower surface 47. The portion protruding from the lower surface 47 of the fit-in part 43 is fitted into the penetration part 31 of the heat sink 30. The size of the protruding portion is similar to or larger than the board thickness of the mounting surface 34 of the heat sink 30. The communicating direction of the insertion hole 431 is bent by approximately 90 degrees between the upper face 46 side and the lower surface 47 side of the light source supporting body 40. Thus, the wiring 5 is guided along the wiring route, and hence a situation is suppressed that an unnecessary stress and the like act on the wiring 5.

The locking part 44 has an approximately L-shaped vertical cross section, and is constructed from a spring part 441 whose board thickness is thin and a stop part 442 whose board thickness is thick. The stop part 442 has a tapered shape whose board thickness is gradually reduced toward the tip so that the locking part 44 easily goes into the locking hole 32. When the locking part 44 is inserted into the locking hole 32, the locking part 44 gradually spreads outward against a biasing force of the spring part 441. After having completely been inserted into the locking hole 32, the stop part 442 returns to the original shape by virtue of the biasing force of the spring part 441. Thus, the stop part 442 is latched to the periphery part of the locking hole 32 so that the light source supporting body 40 is reliably locked by the heat sink 30.

Here, the spring part 441 and the stop part 442 according to the present embodiment may be formed in the heat sink 30 and then the locking hole 32 to which the stop part 442 locks may be formed in the light source supporting body 40, so that the light source supporting body 40 may be locked to the heat sink 30.

Figure 8:
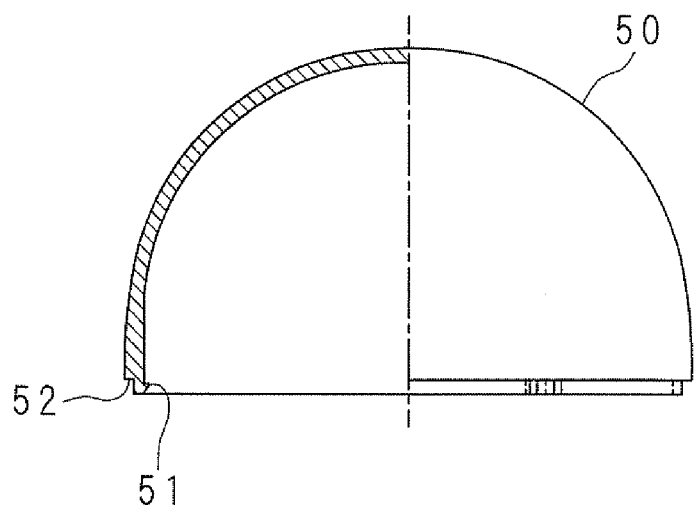
FIG. 8 is a partly sectional view of a cover.

FIG. 8 is a partly sectional view of the cover 50. The cover 50 has the shape of a hollow dome. Then, for example, three protruding parts 51 fitting into the recesses 45 are provided in the contact surface with the light source supporting body 40 in the circumference part 52 abutting against the light source supporting body 40. When the protruding parts 51 are merely fitted into the recesses 45 of the light source supporting body 40, the light source supporting body 40 and the cover 50 are attached to each other. This avoids the necessity of screws and hence simplifies the assembling work.

Figure 9:
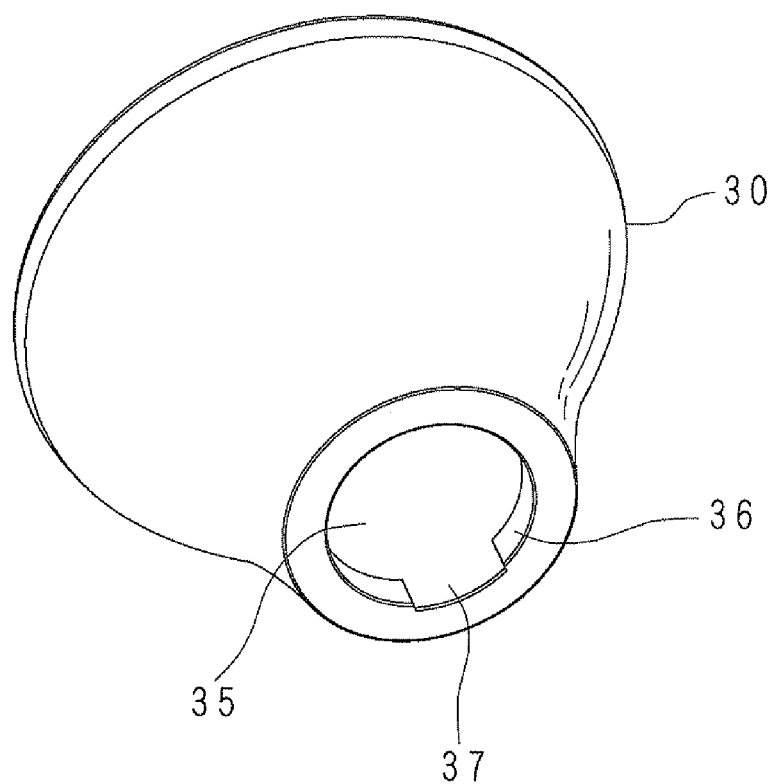
FIG. 9 is a perspective view of an open part side of a heat sink.

FIG. 9 is a perspective view of the open part 35 side of the heat sink 30. The heat sink 30 has a fixing piece 36 provided in the periphery of the open part 35. The fixing piece 36 is an annular member rising toward the inner side of the heat sink 30 in the periphery of the open part 35. Further, a notch 37 is formed in a part of the fixing piece 36.

Here, in the example of FIG. 9 and the like, although not illustrated, in order to improve the heat releasing effect, depressions and protrusions are formed in the surface of the heat sink 30 so as to increase the surface area and increase the area of contact with the outside air. The pattern of depressions and protrusions may be set up appropriately.

Figure 10:
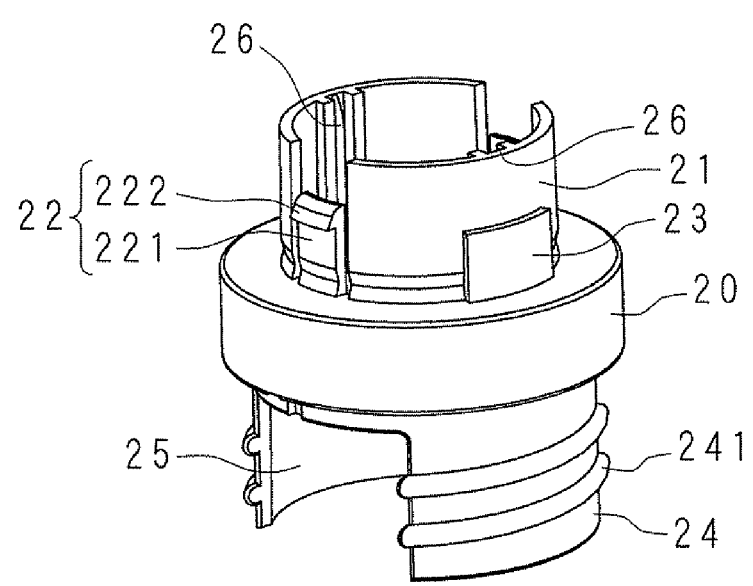
FIG. 10 is a perspective view taken from a heat sink side of an insulating member.
Figure 11:
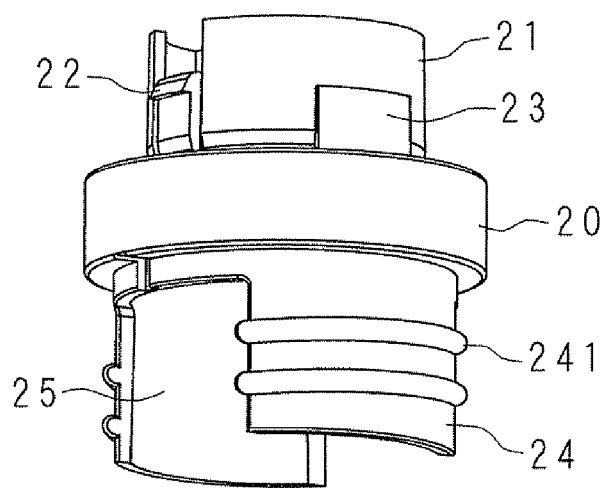
FIG. 11 is a perspective view taken from a cap side of an insulating member.

FIG. 10 is a perspective view taken from the heat sink side of the insulating member 20. FIG. 11 is a perspective view taken from the cap side of the insulating member 20. In a part of the outer periphery of the inserted part 21, a positioning part 23 is formed that has a rectangular shape in approximately the same size as the notch 37. In a case that the heat sink 30 is mounted on the insulating member 20, when the inserted part 21 is inserted through the open part 35, the positions of the positioning part 23 and the notch 37 are aligned to each other. By virtue of this, the inserted part 21 is prevented from rotating freely inside the open part 35, and hence positioning is achieved reliably.

The fitting part 22 has an approximately L-shaped vertical cross section, and is constructed from a spring part 221 whose board thickness is thin and a stop part 222 whose board thickness is thick. The stop part 222 has a tapered shape whose board thickness is gradually reduced toward the tip so that the fitting part 22 easily fits into the fixing piece 36. When the fitting part 22 fits into the fixing piece 36, the fitting part 22 gradually goes narrow inward against a biasing force of the spring part 221. After having passed the peripheral edge of the fixing piece 36, the stop part 222 returns to the original shape by virtue of the biasing force of the spring part 221. Thus, the stop part 222 is latched to the peripheral edge of the fixing piece 36 so that the insulating member 20 is reliably mounted on the heat sink 30.

Figure 12:
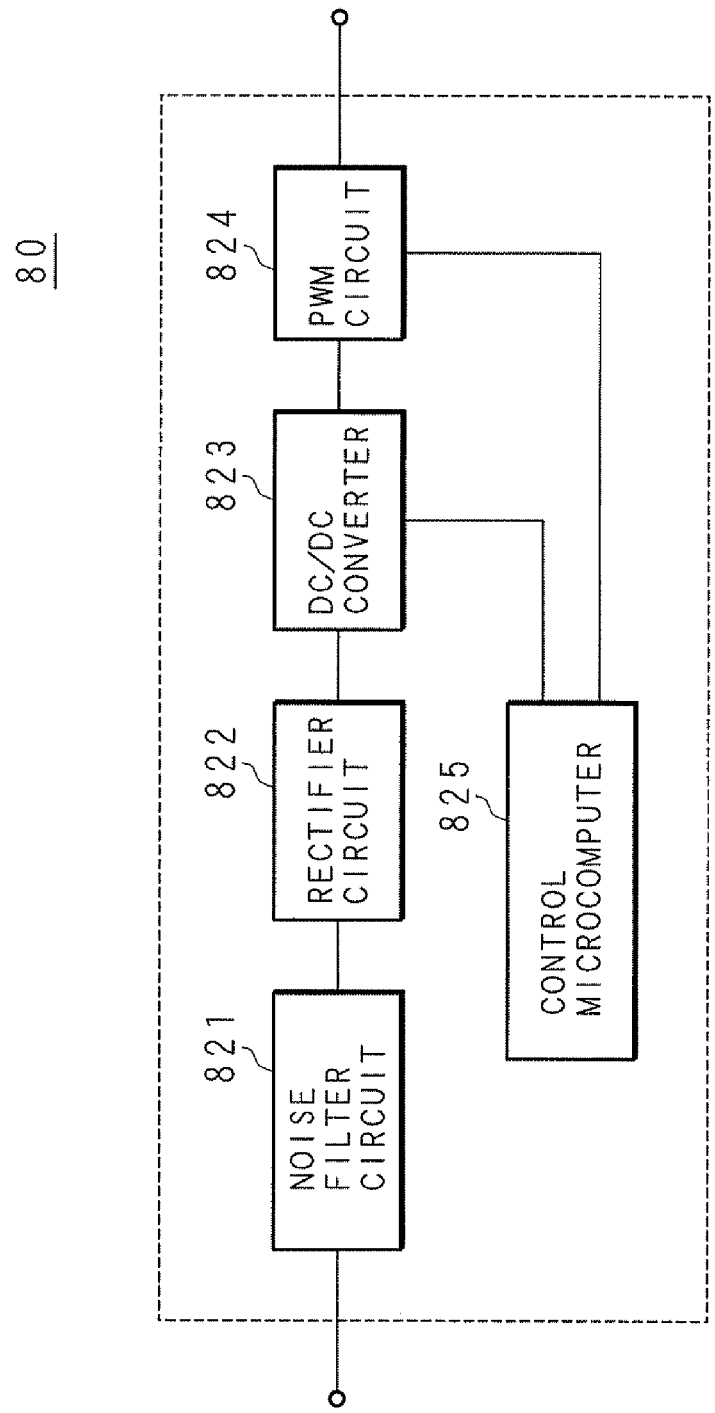
FIG. 12 is a block diagram illustrating an example of a circuit configuration of a power supply part.

FIG. 12 is a block diagram illustrating an example of a circuit configuration of the power supply part 80. The power supply part 80 includes: a noise filter circuit 821 removing noise entering from the commercial power source and the like; a rectifier circuit 822 rectifying and converting an AC voltage into a DC voltage; a DC-DC converter 823 converting the DC voltage outputted from the rectifier circuit 822 into a necessary DC voltage; a PWM circuit 824 performing pulse width modulation onto the DC voltage outputted from the DC-DC converter 823 and thereby controlling the current (electricity) to be supplied to the LED module 60; and a control microcomputer 825 controlling the power supply part 80. These individual parts are constructed from electric components 82.

The power supply part 80 contains heat generating components. Such heat generating components include: a rectifying element in the rectifier circuit 822; a switching element (such as an FET and a transistor) in the DC-DC converter 823; and a switching element (such as an FET and a transistor) in the PWM circuit 824.

Figure 13:
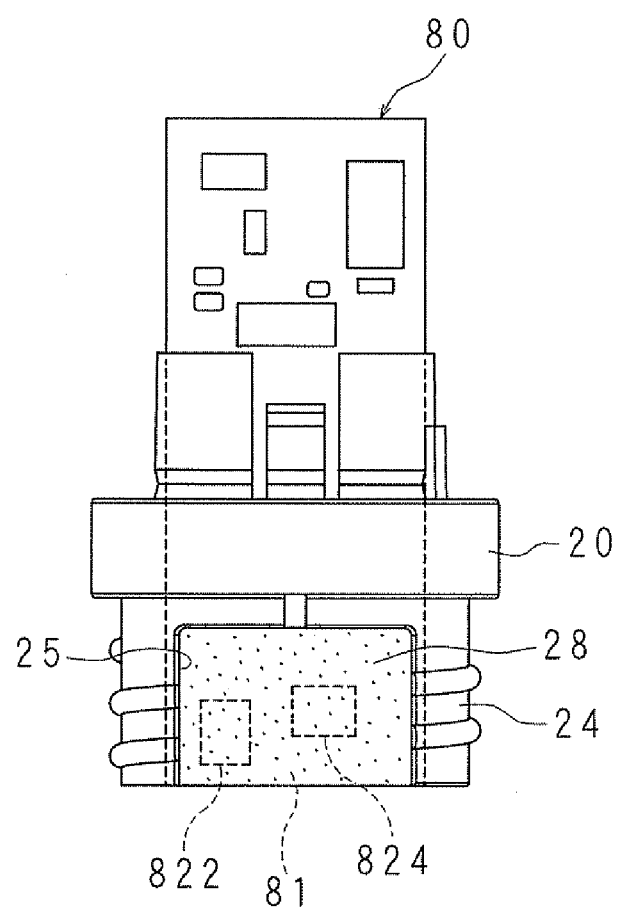
FIG. 13 is a side view of a main part, illustrating an exemplary arrangement of a power supply part.

FIG. 13 is a side view of a main part, illustrating an exemplary arrangement of the power supply part 80. FIG. 13 illustrates a situation that the power source board 81 of the power supply part 80 is mounted on the insulating member 20. Further, for simplicity of description, a situation that the cap 10 is removed is illustrated.

As illustrated in FIG. 13, in the cylindrical insulating member 20, the cap 10 side has a cylindrical connection part 24 to be provided in the inside of the cap 10. The connection part 24 is provided with the opening part 25. A part of the power supply part 80 is arranged in the inside of the connection part 24. That is, a part of the power supply part 80 is contained in the hollow part of the cap 10 in a state of being opposite to the opening part 25. The connection part 24 has the opening part 25, and a part of the power supply part 80 is arranged in the inner side of the connection part 24 in a state of being opposite to the opening part 25. Thus, a part of the power supply part 80 is arranged in the inside of the cap 10 without being blocked by the insulating member 20 (the connection part 24). Thus, heat generated in the power supply part 80 is conducted to the cap 10 through the opening part 25 without being blocked by the connection part 24, and then released through the cap 10 to the outside. Accordingly, the heat generated in the power supply part 80 is released efficiently. Here, in the present embodiment, a part of the power supply part 80 is contained in the hollow part of the cap 10. Instead, the entirety of the power supply part 80 may be contained in the hollow part. That is, it is sufficient that at least a part of the power supply part 80 is contained in the hollow part.

Further, as a part of the power supply part 80, at least one heat generating component such as the rectifying element or the switching element (such as an FET and a transistor) in the rectifier circuit 822 or the PWM circuit 824 is arranged on the cap side in an orientation of being opposite to the opening part 25. Then, the heat generating component having a high heat generation rate is arranged close to the cap 10 without being blocked by the peripheral wall of the connection part 24. Thus, heat is easily transmitted from the heat generating component through the opening part 25 to the cap 10, and hence the heat conduction efficiency is improved. Accordingly, the heat generated by the heat generating component is efficiently released through the cap 10 to the outside.

Further, since the opening part 25 is provided in the connection part 24, the resin fabricated heat conduction member 28 filled up in the connection part 24 such as to be in close contact with the inside of the cap 10 and cover a part of the power supply part 80 is allowed to be provided through the opening part 25. The opening part 25 allows the cap 10 to face a part of the power supply part 80 contained in the hollow part of the cap 10 without being blocked by the connection part 24. Thus, the cap 10 and a part of the power supply part 80 are thermally connected directly to each other through the opening part 25 in between by the heat conduction member 28. Thus, a configuration that the opening part 25 is formed allows that the heat conduction member 28 is easily provided in the connection part 24 in a state that the cap 10 is thermally connected to the power supply part 80.

For example, the heat conduction member 28 may be composed of heat releasing putty such as silicone gel. Alternatively, potting material such as polyurethane may be employed. Heat releasing putty has a comparatively high viscosity. Thus, a larger opening area of the opening part 25 allows the heat releasing putty to go into close contact with the inside of the cap 10. Further, potting material has a comparatively low viscosity. Thus, when a large number of holes are provided as the opening part 25, the potting material goes into close contact with the inside of the cap 10 through the holes. That is, the heat conduction member 28 may be composed of an arbitrary resin having a satisfactory heat conductivity and capable of being provided in the connection part 24 in order to thermally connect the power supply part 80 and the cap 10 to each other.

The heat conduction member 28 covering a part (a heat generating component and the like) of the power supply part 80 is directly in close contact with the cap 10 through the opening part 25. Thus, the heat generated in the power supply part 80 is released through the heat conduction member 28 via the cap 10 to the outside.

Here, in the present embodiment, the heat conduction member 28 is filled up in the entirety of the connection part 24. Instead, the heat conduction member 28 may be provided partly in the connection part 24 as long as a part, such as a heat generating component, of the power supply part 80 and the cap 10 are thermally connected to each other. Further, in the present embodiment, the heat generating component is located opposite to the opening part 25. Instead, the heat generating component may be located not opposite to the opening part 25 and may be located on the cap 10 side. That is, as long as the heat generating component and the cap 10 are thermally connected to each other through the heat conduction member 28 via the opening part 25, the heat generating component may be located not opposite to the opening part 25. However, when the heat generating component is located opposite to the opening part 25, the heat generating component is not blocked by the connection part 24 and the cap 10 and the heat generating component are easily connected thermally to each other through the heat conduction member 28. Thus, this configuration is preferable.

Further, a part of the power source board 81 is arranged in the connection part 24. Thus, the size of the power source board 81 contained in the heat sink 30 is reduced. Accordingly, the length (height) dimension of the heat sink 30 is reduced and hence size reduction is achieved in the lighting apparatus 100.

Here, in the present embodiment, as illustrated in FIG. 11 and the like, two opening parts 25 are provided. Instead, a single opening part 25 may be provided. In a case that two opening parts 25 are provided, when the power source board 81 of double-side mounting type is employed, heat from heat generating components mounted on the two faces of the power source board is conducted through the heat conduction member 28 to the cap 10. This improves further the heat releasing effect.

In the above-mentioned embodiment, description has been given for a case that a lighting apparatus of electric bulb shape. However, employable shapes of the lighting apparatus are not limited to the electric bulb shape. That is, a lighting apparatuses of another shape such as a buried type lighting apparatus (a so-called downlight) may be employed. Further, description has been given for a case of a lighting apparatus employing an LED module as a light source. However, employable light sources are not limited to the LED module. That is, an arbitrary light emitting element of surface light emission such as an EL (Electro Luminescence) device may be employed.

In the above-mentioned embodiment, a single LED module 60 serving as a light source is mounted to the mounting surface 34. However, employable configurations are not limited to this. That is, a plurality of LED modules may be provided in a circumference arrangement, a lattice arrangement, or a line arrangement. In this case, the plurality of LED modules may be held on the heat sink by a light source supporting body provided with fitting holes into which the LED modules are fitted and which are provided in a number corresponding to the number of LED modules.

Further, even a light source other than the chip-on-board type described above may be employed as long as the light source is constructed such that surface mount type LEDs serving as light emitting parts are mounted on a printed circuit board serving as a base. In this case, the light source supporting body has fitting holes in a number corresponding to the number of light emitting parts. Then, the plurality of surface mount type LEDs serving as light emitting parts are fitted individually into the fitting holes so that the light source is held on the heat sink.

In the above-mentioned embodiment, attaching between the cover 50 and the light source supporting body 40, between the light source supporting body 40 and the heat sink 30, between the heat sink 30 and the insulating member 20, between the insulating member 20 and the cap 10, and the like is achieved merely by simple fitting with each other. Thus, the necessity of screws is avoided completely and hence workability in the assembling work is improved in comparison with the conventional art. Here, for the purpose of strength improvement, adhesives may be applied on the connections between the cover 50 and the light source supporting body 40, between the light source supporting body 40 and the heat sink 30, between the heat sink 30 and the insulating member 20, between the insulating member 20 and the cap 10, and the like.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A lighting apparatus comprising:
   a light source having a base and a LED mounted on the base;
   a heat sink releasing heat from the light source; and
   a light source supporting body having:
   a locking part locking into the heat sink so as to hold the light source on the heat sink,
   a fitting hole having approximately the same size as the base, the fitting hole extracting light from the light source and fitting to the light source so as to position the light source, and
   a protruding part provided in a part of the periphery of the fitting hole, wherein
   an inner periphery part of the fitting hole fits an outer periphery of the base so as to fix the attaching position of the light source, the protruding part configured to protrude toward a facing portion of the inner periphery part of the fitting hole along a surface of the base, and the protruding part configured to pinch a part of the base between the protruding part and the heat sink, wherein the heat sink, fabricated from a metal, includes a penetration part, and the light source supporting body, fabricated from a resin, includes a fit-in part fitted into the penetration part, and an insertion hole, through which a wiring connected to the light source is inserted, is formed in the fit-in part.

2. The lighting apparatus according to claim 1, further comprising a cover covering the light source, wherein the light source supporting body serves also as a reflection part reflecting light emitted from the light source and then reflected by the cover.

* * * * *